United States Patent [19]

Helbert

[11] Patent Number: 4,497,890
[45] Date of Patent: Feb. 5, 1985

[54] PROCESS FOR IMPROVING ADHESION OF RESIST TO GOLD

[75] Inventor: John N. Helbert, Scottsdale, Ariz.

[73] Assignee: Motorola, Inc., Schaumburg, Ill.

[21] Appl. No.: 483,088

[22] Filed: Apr. 8, 1983

[51] Int. Cl.³ .......................................... H01L 21/312
[52] U.S. Cl. ..................................... 430/296; 427/82;
      427/96; 427/240; 427/409; 430/318; 430/319;
      430/327; 430/942; 430/967
[58] Field of Search ................... 427/82, 240, 96, 409;
      430/327, 318, 319, 296, 942, 967

[56] References Cited

U.S. PATENT DOCUMENTS

| | | | |
|---|---|---|---|
| 3,482,977 | 12/1969 | Baker | 430/327 |
| 3,549,368 | 12/1970 | Collins | 430/327 |
| 3,911,169 | 10/1975 | Lesaicherre | 430/327 |
| 4,075,367 | 2/1978 | Galett | 427/94 |
| 4,371,565 | 2/1983 | Baise | 427/82 |

FOREIGN PATENT DOCUMENTS 57-130432 8/1982 Japan .................................. 430/327

Primary Examiner—John D. Smith
Attorney, Agent, or Firm—Joe E. Barbee; John A. Fisher

[57] ABSTRACT

A process is disclosed for improving the adhesion of a polymeric resist to a gold metallization surface. The process includes the use of a chelating silane as an adhesion promoter between the resist and the gold metallization surface. The improved resist adhesion to the gold metallization surface is attributed to a complexation or chemisorption mechanism. The adhesion promoters of interest contain moieties capable of acting as chelating or chemisorption sites on the molecular silane, thus creating layer-to-layer bonding with greater strength than that observed where just Van der Waals interactions occur to the gold surface atoms.

8 Claims, 6 Drawing Figures

PROCESS FOR IMPROVING ADHESION OF RESIST TO GOLD

BACKGROUND OF THE INVENTION

This invention relates generally to adhesion promotion and, more specifically, to a process for promoting the adhesion between polymeric resists and gold surfaces and to articles made thereby.

In the fabrication of certain articles, a radiation sensitive layer of material is patterned and then used as a process mask in subsequent process steps. For example, in the fabrication of semiconductor devices, radiation sensitive layers of etch resistant material are used to pattern both semiconductor substrates and the material present on the substrates. A layer of radiation sensitive polymeric resist material is formed overlying the substrate and is exposed either optically or using an electron beam or soft x-rays to form patterns of exposed and unexposed resist. Depending upon the type of resist material used, either the exposed or unexposed areas are removed to leave an etch resistant pattern on the substrate. The resist mask is then used as an etch mask to etch a carefully controlled pattern in the material underlying the resist. To closely replicate the resist mask the resist must remain adherent to the underlying material during the etching process. If the patterned resist layer does not adhere, in its entirety, to the underlying surface, the etchant will encroach under the lifted resist and the pattern will not be replicated.

To insure that the resist layer adheres to the underlying material, it has become conventional with some underlying materials to use an adhesion promoter. Silane coupling agents, for example, are well-known when the underlying material comprises a mineral surface such as silicon dioxide or an aluminum metal surface. Silane coupling agents promote polymer adhesion to the underlying mineral surface through a chemical interaction with surface silanol defects encountered at the surface. Analogous surface defects, aluminols

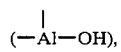

are present on an oxidized aluminum surface and good adhesion to this surface is achieved by chemical interaction between adhering polymeric films and the surface defects. The common adhesion promoters which provide satisfactory adhesion between resist and either mineralized or aluminum surfaces generally fall in the category of halogenated alkoxy or amino silanes.

In some articles, including, for example, bubble memory devices and some semiconductor devices, especially advanced bipolar circuits, RF transistors, and very high performance, high density integrated circuits, there is a need for patterned gold metallization. The gold metallization, especially in contrast to aluminum metallization, is very resistant to chemical corrosion, is much less prone to electromigration effects, and provides a high conductivity electrical interconnection. When using gold as the metallization layer, and especially where metal patterns involve lines of width less than 2–3 micrometers, it becomes imperative that the polymeric resist have excellent adhesion to the gold surface. Heretofore, however, there has not been a process for achieving satisfactory adhesion between polymeric resist materials and gold surfaces. The conventional adhesion promoters which are satisfactory for aluminum or mineral surfaces are not effective with gold surfaces. The difference between gold and either aluminum or mineral surfaces is apparently that gold has a drastically different surface; gold does not possess surface adhesion promoting defects because it is a noble metal and is essentially corrosion and oxidation resistant. While the surface of aluminum, for example, is known to be easily chemically oxidized, gold is not oxidized even under oxygen plasma conditions.

It is therefore an object of the present invention to provide an improved process for enhancing the adhesion of polymeric resist materials to gold surfaces.

It is a further object of this invention to provide a process for lithographically patterning gold layers on a semiconductor device.

It is a still further object of this invention to provide an improved article having a layer of patterned gold metallization.

It is a still further object to provide an improved semiconductor device.

It is yet another object of this invention to provide an improved process for fabricating a semiconductor device.

BRIEF SUMMARY OF THE INVENTION

The foregoing and other objects and advantages of the invention are achieved through the use of an improved adhesion promoting process. Gold metallization is patterned by applying to the surface of the gold metallization a layer of a chelating silane. A polymeric resist for lithographic patterning is thereafter applied to the gold surface having the chelating silane adhesion promoter thereon. The resist is patterned and used as a process mask in subsequent processing.

DETAILED DESCRIPTION OF PREFERRED EMBODIMENTS

Figure 1:
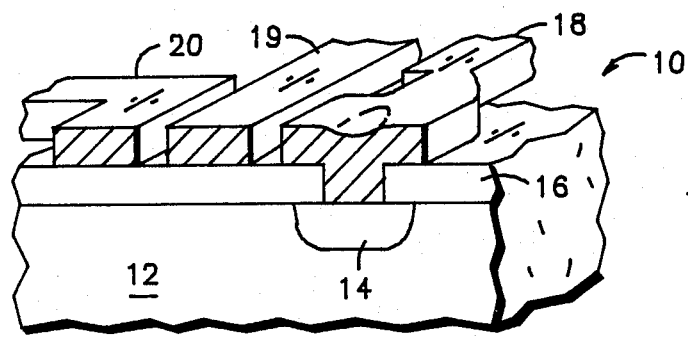
FIG. 1 illustrates a portion of a semiconductor device fabricated in accordance with the invention.

FIG. 1 illustrates an article, specifically in this embodiment a portion of a semiconductor device 10 which can be fabricated through practice of the invention. Semiconductor device 10 includes, for example, a semiconductor substrate 12 in which regions of opposite conductivity type 14 may be formed. Overlying most of the surface of the semiconductor substrate is an insulating layer 16 of a material such as silicon dioxide. A pattern of gold interconnection lines 18, 19, 20 is formed on the insulator layer. The gold interconnection contacts device regions 14 and, if device 10 is an integrated circuit, connects the appropriate devices such as transistors, resistors, and the like which make up the semiconductor device.

Figure 2:
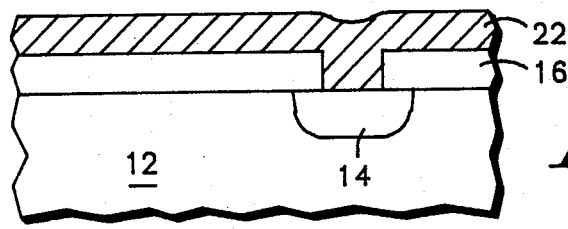
FIGS. 2–5 illustrate a sequence of process steps, in accordance with the invention, for fabricating a semiconductor device.

FIGS. 2–5 illustrate, in cross-section, a sequence of steps by which the semiconductor device of FIG. 1 is fabricated in accordance with the invention. FIG. 2 illustrates a portion of the semiconductor device structure in which the preliminary processing steps have been completed. The partially completed structure includes a semiconductor substrate 12 of silicon, gallium arsenide, or other semiconductor material. Part of the semiconductor structure may include device regions 14 of conductivity type opposite that of the substrate. The device regions can be formed by thermal diffusion, ion implantation, or the like. The semiconductor structure also may include an insulating layer 16 which covers most of the semiconductor substrate, with apertures formed in the layer to expose selected portions of the substrate or the device regions. Insulating layer 16 will be found in most semiconductor devices, but in certain application such as, for example, a gallium arsenide Schottky barrier gate MESFET, the patterned gold metallization described hereinafter may be patterned directly on the semiconductor substrate. A layer of gold metallization 22 is applied overlying insulator layer 16 (or directly on the semiconductor substrate, as the case may be). The term "gold metallization" is herein used to include a metal structure having a gold upper surface, i.e., either a single layer of gold or a layer of gold overlying other metals, silicides, or the like. One structure within this definition is, for example, a metal silicide making contact to device region 14, a layer of refractory metal such as a mixture of titanium and tungsten, and an overlying layer of gold.

Figure 3:
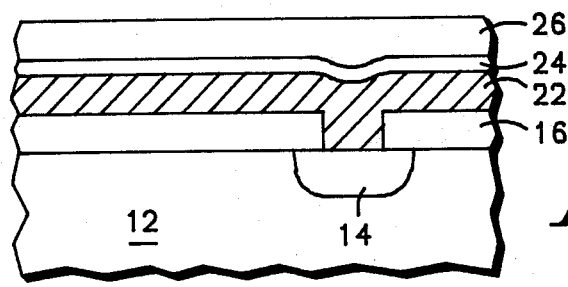

The process is continued, in accordance with the invention, as illustrated in FIG. 3. To pattern the layer of gold metallization 22, a layer of polymeric resist material 26 is applied overlying the device structure. To enhance the adhesion of the layer of polymeric resist to the gold metallization, a chelating silane adhesion promoter 24 is applied directly to the surface of the gold metallization layer 22 before the application of the polymeric resist.

Figure 4:
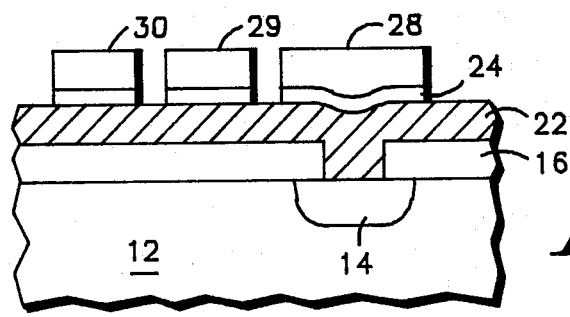

FIG. 4 illustrates the patterning of the resist layer 26 in the pattern that it is desired to replicate in the underlying gold metallization. The resist layer is patterned in conventional manner using optical, electron beam or x-ray exposure. Selected portions of the resist layer are exposed to form regions of exposed resist while leaving other areas of unexposed resist. After subsequent development of the resist layer, either the exposed or unexposed regions will be left on the gold surface depending upon whether the mask tone is negative or positive. The remaining resist regions form a pattern 28, 29, 30 on the gold layer which is the same as the pattern of gold that is desired on the finished device.

Figure 5:
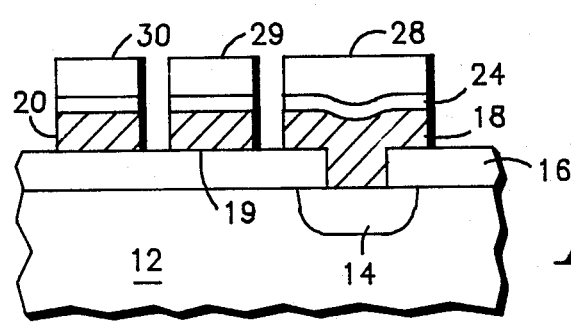

FIG. 5 illustrates the use of the patterned resist layer to etch the underlying gold metallization in a pattern of gold interconnections 18, 19, 20. In this etching operation the photoresist pattern is replicated in the underlying gold metallization. To fully replicate the pattern, however, it is necessary that the resist strongly adhere to the underlying gold metallization. Following the patterning of the gold metallization, the photoresist pattern is removed to yield the device structure 10 illustrated in FIG. 1.

In accordance with the invention, the improved adhesion between the polymeric resist material and the surface of the gold metallization is achieved by applying a chelating silane adhesion promoter to the gold surface. The chelating silane adhesion promoter can be, for example, 2-(diphenylphosphino)ethyltriethoxysilane (DPETS), trimethylsilylacetamide (TMSA), bis[3-(triethoxysilyl)propyl]tetrasulphide (BTPTS), or 3-mercaptopropyltriethoxysilane (MPTS). While the inventor does not wish to be bound by any theory, and the invention should not be limited by such theory, the improved lithographic resist adhesion to gold when using a chelating silane promoter in accordance with the invention, is attributed to a complexation or chemisorption mechanism. The

of TMSA,

of BTPTS and MPTS, and

of DPETS, for example, are moieties capable of acting as chelating or chemisorption sites on the molecular silanes, thus creating layer-to-layer bonding with greater strength than that observed where just Van der Waals interactions occur to the gold surface atoms.

Figure 6:
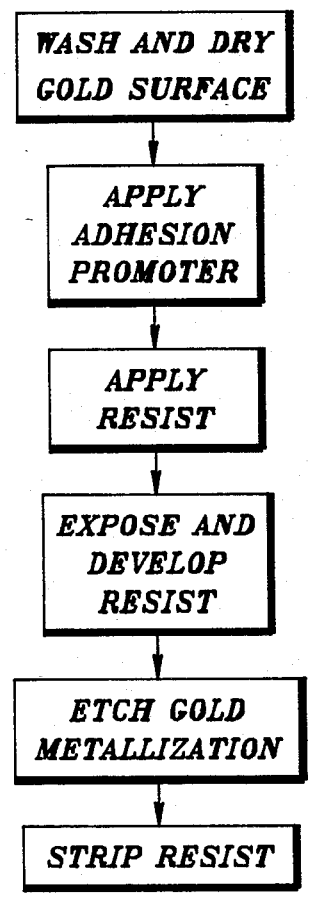
FIG. 6 presents a flow diagram of a process, in accordance with one embodiment of the invention, for promoting the adhesion of a polymeric resist to an underlying gold surface.

FIG. 6 presents a flow chart for the patterning of an article including a gold metallization layer in accordance with a specific preferred embodiment of the invention. The gold substrate to be patterned is cleaned by rinsing the surface with water and then drying 30–60 minutes in a dry ambient at 200° C. The adhesion promoter is applied to the clean, dry gold surface as a dilute solution of 0.3–7.0 weight percent in acetone or other solvent that does not chemically interact with the promoter. A volume of the promoter solution is applied to the gold surface which is then spun for one second at 500 rpm followed by 15 seconds at 5,000 rpm. This coats the gold surface with a monolayer or so of promoter. The adhesion promoter is selected, for example, from the chelating silanes listed above.

The dried gold surface coated with adhesion promoter is then coated with a positive polymeric resist such as PC-129-SF or P-2025, both available from Allied Chemical. The resist is applied by spinning the substrate at 500 rpm for one second, followed by 20 seconds at 4500 rpm. The substrate is then baked in an air convection oven for 30 minutes at 90° C. The bake is, of course, dependent upon the particular resist used. The resist layer is then actinically exposed using either ultra-violet light through a patterned photomask, by writing with a 20 Kev electron beam, or masked soft x-rays. Following exposure the resist images are developed to leave a patterned resist mask on the gold surface.

Using the patterned resist layer as an etch mask the gold metallization is selectively etched using either a wet chemical etchant or plasma etching. Etching using the resist as an etch mask replicates the resist pattern in the underlying gold metallization. Following the etching of the metallization, the resist is stripped from the device surface using a conventional resist stripping solvent or an oxygen plasma.

A number of device structures were processed using the foregoing process to pattern a layer of gold metallization. The gold metallization had a thickness in the range of 400–600 nanometers. In patterning the gold metallization a number of different chelating silane promoters were used, each diluted with acetone to achieve the proper concentration as follows:

| DPETS | 1.2 ml per 25 ml acetone. |
| TMSA | 0.05 g to 0.10 g solid per 23 ml acetone |
| BTPTS | 2 ml per 25 ml acetone |
| MPTS | 2 ml per 25 ml acetone. |

Patterns were exposed in the resist having varying dimensions from 0.5–5 micrometers in width and 4–20 micrometers in length. Control substrates received identical treatment except that no adhesion promoter was applied before the photoresist was applied. The control substrates exhibited 50–90% image lifting resulting from adhesion failure between the photoresist and the gold surface. In some control tests no lifting occurred but inferior adhesion was observed at pattern edges. Adhesion failures occurred most frequently with electron beam exposure, but were also observed on optically exposed substrates. No adhesion failures were observed with substrates processed in accordance with the invention using a chelating silane adhesion promoter. Substrates prepared in accordance with the invention were even capable of withstanding 30–40% overdevelopment without incurring any image lifting.

A particularly severe adhesion problem is usually encountered when attempts are made to rework substrates; that is, when, for one reason or another, it becomes necessary to remove the initial layer of resist material and to reapply a second layer. In such rework situations the gold surface is first solvent cleaned, for example with acetone, followed by 10–30 minutes of cleaning in an oxygen plasma. The adhesion promoter and resist material are then applied as in the process described above. Using the adhesion promoters in accordance with the invention, even rework wafers exhibited no evidence of pattern lifting.

Additional wafers were processed as above, except that conventional halogenated, alkoxy or amino silanes were used as adhesion promoters. These adhesion promoters are of the type normally used successfully for improved resist adhesion to silicon dioxide or aluminum surfaces. No improvement in resist adhesion was observed in comparison to the control substrates processed above without any adhesion promoter.

Thus it is apparent that there has been provided, in accordance with the invention, an improved method and article achieved thereby for improving the adhesion of polymeric resist to gold surfaces which fully meet all the objects and advantages set forth above. While the invention has been described and illustrated by reference to specific embodiments thereof, it is not intended that the invention be limited to these illustrative embodiments. Those skilled in the art will appreciate, after review of the foregoing detailed description, that variations and modifications in these embodiments are possible without deviating from the spirit and scope of the invention. The invention has been found particularly necessary and efficacious when using positive tone resists. Conventional negative photoresists are usually less prone to adhesion problems and thus do not require an adhesion promoter, but the invention will probably prove advantageous when used with negative x-ray or electron beam resists. Other articles, other means for applying the adhesion promoter and other diluants for the promoter as well as other concentrations, for example, may be employed. Accordingly it is intended to include within the invention all such variations and modifications as fall within the scope of the appended claims.

I claim:

1. A process for increasing the adhesion of a polymeric resist to a gold metallization surface which comprises the steps of:
    applying to the gold metallization surface a layer of chelating silane; and
    applying the polymeric resist to the layer of chelating silane.

2. The process of claim 1 wherein the chelating silane is selected from the group consisting of:
    2-(diphenylphosphino)ethyltriethoxysilane, trimethylsilylacetamide,
    bis[3-triethoxysilyl)propyl]tetrasulphide, and 3-mercaptopropyltriethoxysilane.

3. A process for fabricating a semiconductor device comprising the steps of:
    providing a semiconductor substrate;
    applying a layer of gold metallization overlying said substrate;
    applying to said layer of gold metallization a chelating silane adhesion promoter;
    applying a layer of polymeric resist to said chelating silane adhesion promoter;
    exposing said layer of polymeric resist to form regions of exposed resist and regions of unexposed resist;
    developing said layer of polymeric resist material to remove one of said exposed or unexposed resist regions leaving the other of said exposed or unexposed resist regions as an etch mask; and
    etching said layer of gold metallization through openings in said etch mask.

4. The process of claim 3 wherein said chelating silane adhesion promoter is selected from the group consisting of:
    2-(diphenylphosphino)ethyltriethoxysilane, trimethylsilylacetamide,
    bis[3-(triethoxysilyl)propyl]tetrasulphide, and 3-mercaptopropyltriethoxysilane.

5. The process of claim 3 wherein said step of exposing comprises optically irradiating said layer with actinic radiation through a patterned photomask.

6. The process of claim 3 wherein said step of exposing comprises selectively irradiating said layer with an electron beam.

7. The process of claim 3 wherein said step of exposing comprises selectively irradiating said layer with soft x-rays.

8. The process of claim 3 wherein said polymeric resist has a positive tone.

* * * * *